(12) United States Patent
Osterried et al.

(10) Patent No.: US 7,061,698 B2
(45) Date of Patent: Jun. 13, 2006

(54) LENS SYSTEM, IN PARTICULAR A PROJECTION LENS SYSTEM FOR SEMICONDUCTOR LITHOGRAPHY

(75) Inventors: Karlfrid Osterried, Aalen (DE); Thomas Petasch, Aalen (DE); Jens Kugler, Heubach (DE)

(73) Assignee: Carl Zeiss SMT AG, Oberkochen (DE)

( * ) Notice: Subject to any disclaimer, the term of this patent is extended or adjusted under 35 U.S.C. 154(b) by 275 days.

(21) Appl. No.: 10/131,957

(22) Filed: Apr. 25, 2002

(65) Prior Publication Data

US 2002/0167740 A1 Nov. 14, 2002

(30) Foreign Application Priority Data

May 2, 2001 (DE) .......................... 101 21 346

(51) Int. Cl.
*G02B 7/02* (2006.01)
*G03B 27/42* (2006.01)

(52) U.S. Cl. .................... 359/819; 359/822; 359/827; 355/53

(58) Field of Classification Search ............... 359/804, 359/811, 818, 819, 822, 823, 827; 355/53
See application file for complete search history.

(56) References Cited

U.S. PATENT DOCUMENTS

| 4,295,721 | A | * | 10/1981 | Rebikoff | 396/26 |
| 5,052,782 | A | * | 10/1991 | Myer | 359/827 |
| 5,926,326 | A | * | 7/1999 | Fischer et al. | 359/819 |
| 5,973,863 | A |   | 10/1999 | Hatasawa et al. | 359/823 |
| 6,014,455 | A | * | 1/2000 | Sumiyoshi et al. | 382/144 |
| 6,400,516 | B1 | * | 6/2002 | Spinali | 359/819 |

OTHER PUBLICATIONS

Chapter 40, entitled Optical Fabrication, by Robert E. Parks, from the Handbook of Optics, Vol. I, Fundamentals, Techniques, and Design, Second Edition, published by McGraw Hill, Inc., Sep. 1994.

* cited by examiner

*Primary Examiner*—Tim Thompson

(57) ABSTRACT

In the case of a lens system (1), in particular in the case of a projection lens system for semiconductor lithography, it is possible to exchange at least one optical element, in particular the final optical element in the beam direction in the form of an end plate (3). For adjusting the exchangeable optical element (3), an optical quality fit with a fitting surface (6) is set between the optical element (3) and a mount (5) or a part connected to a mount (5).

46 Claims, 4 Drawing Sheets

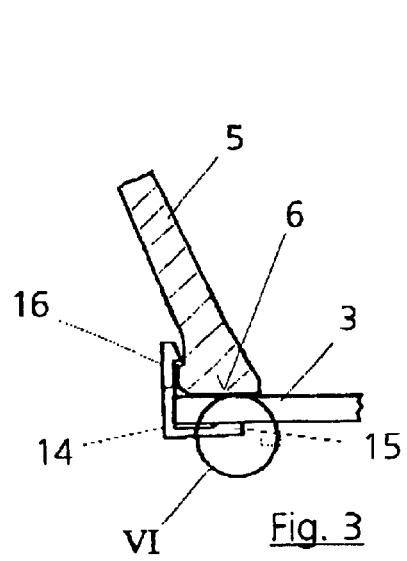
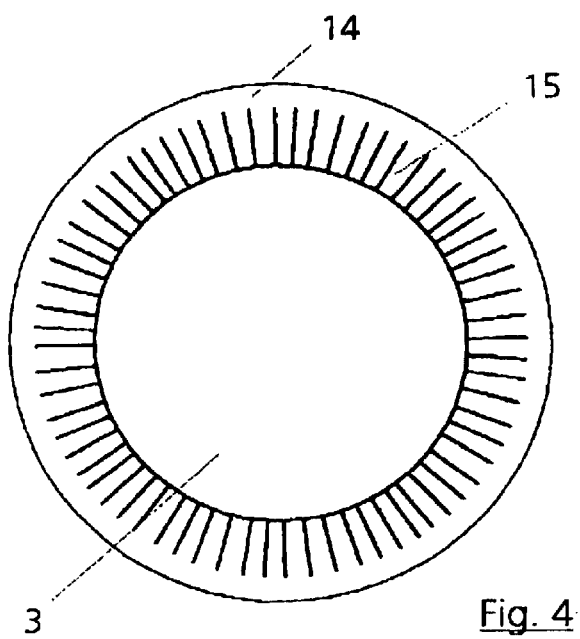
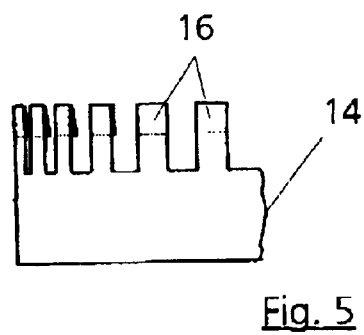
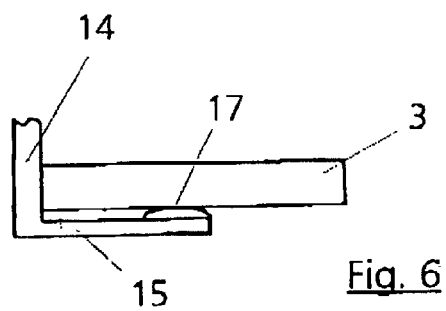
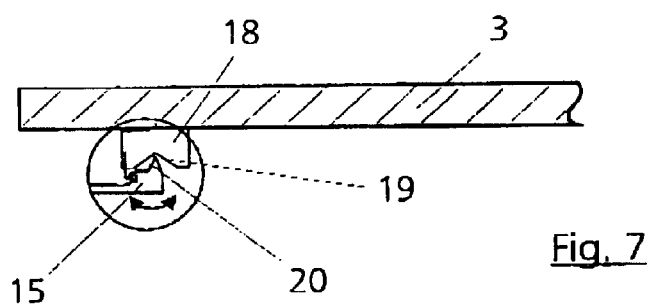

LENS SYSTEM, IN PARTICULAR A PROJECTION LENS SYSTEM FOR SEMICONDUCTOR LITHOGRAPHY

BACKGROUND OF THE INVENTION

1. Field of the Invention

The invention relates to a lens system. More specifically the invention relates to a projection lens system for semiconductor lithography with at least one exchangeable optical element, in particular the final optical element in the beam direction in the form of an end plate.

2. Description of the Related Art

In the case of lens systems in semiconductor lithography, it is necessary, from time to time, to make subsequent corrections in order to eliminate aberrations or to increase the imaging accuracy. For this reason, it is possible for individual optical elements, e.g. the end plate, to be designed in an exchangeable manner, in order that, for example, lens-system aberrations may be optimized. The same also applies in the case of an optical element being damaged or subjected to wear. This applies, in particular, to the end plate in a projection lens system. In the case of such an exchange, however, the intention is to achieve reproducibility in order that new errors do not slip in.

For this purpose, U.S. Pat. No. 5,973,863 has already disclosed the practice of connecting the end plate of a lens system in semiconductor lithography in an exchangeable manner to the mount in order for it to be possible to correct spherical aberrations or other aberrations of the projection system. A screw-connection between the plate and the mount is proposed for this purpose.

In order to achieve exchangeability of an optical element in a lens system, it is already generally known, in principle, to provide a method of connection other than an adhesive connection between the optical element and its mount. For this purpose you are referred, for example, to the earlier application 199 29 403.8, in which an end element is connected to the adjacent optical element by wringing.

SUMMARY OF THE INVENTION

The object of the present invention is to provide an adhesive-free method of connection between an optical element and the associated mount, or a part connected to a mount, which, if required, provides straightforward exchangeability of an optical element with a high level of reproducibility.

This object is achieved according to the invention for a lens system, comprising at least one exchangeable optical element and a mount, said optical element being positioned relative to said mount in an optical quality fit with a fitting surface. With other words: an optical register with surface fit is set between the exchangeable optical element and a mount or a part connected to a mount.

In a preferred mode of the invention said mount comprises a surface area of optical quality finish of form and surface, fitting to a surface area of said optical element.

In a preferred mode of the invention said exchangeable optical element is arranged in a projection lens system for semiconductor lithography.

In a further preferred mode of the invention said exchangeable optical element is the final optical element in the beam direction in the form of an end plate.

According to the invention, an adhesive-free connection achieves a situation, inter alia, where the mount or the part connected to the mount has the same register or optical quality fit on an interferro-metric/optical scale, as the optical element. In this way, it is possible to fulfill the following requirements:

- elimination of or a reduction and straining of the optics as a result of installation and of differences in pressure, and thus an improvement in imaging property
- reproducibility of the imaging properties of the lens system during removal and installation
- exchangeability in the field for an optically equivalent element (e.g. center thickness, radii, refractive index, wave front in double transit)
- a vast reduction in the bending resulting from internal pressure in the case of an endplate as optical element or in the case of a relatively thin lens on account of being mounted in a state in which it is "clamped in on all sides"
- an improvement in the transmission by the elimination of contamination and of adhesive protection on account of the absence of adhesive
- sealing in the case of a 360° mount.

A register or optical quality fit of <20 nm is generally provided according to the invention.

The attachment of the optical element may be achieved in design terms by the following solutions:

1. generating a pneumatic negative pressure
2. by adhesive forces between surface fits, the so-called wringing
3. by a clamping connection e.g. by a clamping ring with resilient elements.

It is also possible, if appropriate, for the three solutions to be combined with one another.

The individual solutions here are to be realized such that the attachment forces are sufficient in order to safeguard the optical element against transport-induced decentering and, if appropriate, to seal the optical element or also retain it counter to an internal pressure and the dead weight.

For safety reasons, it is advantageously possible in addition to provide a securing bracket for the optical element.

If isolation of deformation is desired, provision may also be made for the mount for the exchangeable optical elements to be of two-part configuration, namely with an inner mount, which is provided for the optical register with surface fit, and a correspondingly more rigid outer mount.

The mount provided for the optical quality fit or register with fitting surface or surface fit may be the dedicated mount of the optical element or, alternatively, also the mount of the adjacent optical element.

Advantageous developments and configurations of the invention can be gathered from the rest of the subclaims and from the exemplary embodiments described in principle herein below with reference to the drawing.

BRIEF DESCRIPTION OF THE DRAWINGS

FIG. 3 shows, in detail form, an end plate with a clamping device;

FIG. 4 shows a view of the clamping ring according to FIG. 3 from beneath;

FIG. 5 shows an enlarged detail of the clamping ring in side view with resilient elements;

FIG. 6 shows an enlarged detail, corresponding to VI in FIG. 3, of the contact-pressure region of the resilient elements;

FIG. 7 shows an enlarged detail, corresponding to FIG. 6, of a different configuration;

DETAILED DESCRIPTION

Figure 1:
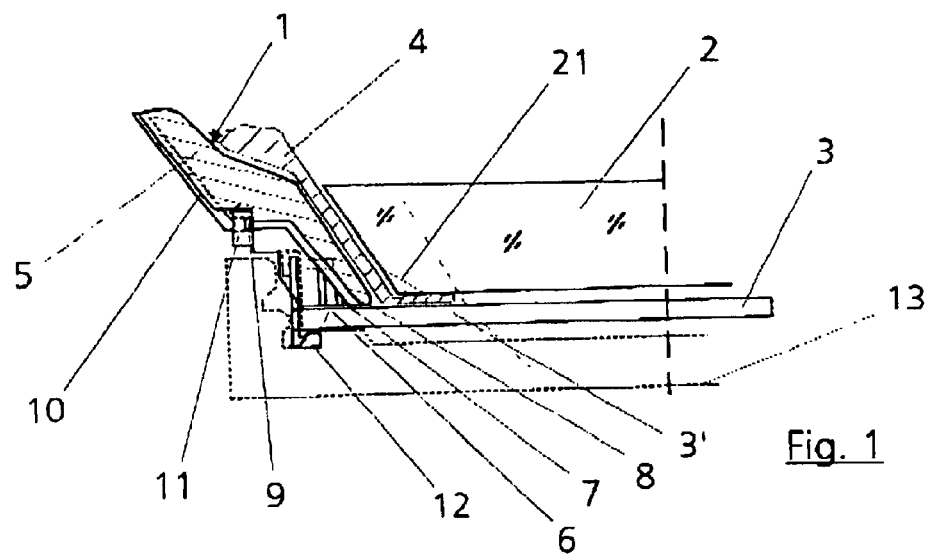
FIG. 1 shows a (partial) longitudinal section through the bottom region of a lens system with an end plate.

A projection lens system 1 (only partially illustrated) for semiconductor lithography has a plurality of lenses 2 (only the final one is illustrated) and an end plate 3 as the final optical element. The lens 2 is mounted in an inner mount 4, which is connected in a manner which is not illustrated specifically to an outer mount 5 of the projection lens system 1.

A connecting surface as fitting surface or surface fit 6 in relation to the end plate 3 is optically planar. It is interrupted by bores 7 which form a distributor system of pneumatic channels 8 in the mount 5. The aim is a homogenous action of force over the surface area of the end plate 3, the intention being to avoid local bending. The number, the size and the density of the bores 7 depends on the application and on the pneumatic pressure. The shape of the bore openings should be selected, in production terms, such that a continuous surface fit is also achieved at the bore edges. For this reason, glass or ceramic material has been found to be a particularly suitable material for the mount 5. The individual channels 8 are connected by an annular channel 9, with the result that just one supply line 10 is necessary for pressure supply. The annular channel 9 is formed by an encircling groove in a screw-on ring 11 with internal thread, said screw-on ring being screwed onto the mount 5. The screw-connection here should be of gas-tight configuration. The screw-on ring 11, at the same time, contains a connection for the supply line 10.

In order to secure the end plate 3, e.g. during transportation, one or more securing brackets 12 may be provided as independent components which are fastened following completion of machining of the mount 5. Since the securing brackets 12 only have to withstand the deadweight of the end plate 3, a configuration with three individual, circumferentially distributed brackets in an elastic configuration may be sufficient, with the result that the installation of the securing brackets 12 does not adversely effect the fitting quality of the connecting surface as surface fit 6.

If appropriate, it is also possible for the securing brackets 12 to be integrated in the screw-on ring 11 with a corresponding extension. If required, the screw-on ring 11 may also be used for centering. For this purpose, it may be provided with corresponding centering collars. The same also applies to centering collars on the end plate 3. Via an installation box 13, which is illustrated by dashed lines, the centering can then take place during installation.

FIGS. 3 to 7 provide a means of connection for the end plate 3 as exchangeable optical element in the form of a clamping device with a clamping ring 14 which has a multiplicity of resilient elements 15. The resilient elements 15 press the end plate 3 onto the surface fit 6 of the mount 5. The clamping ring 14 has an L-shaped profile in cross section, the resilient elements 15 being formed by radial incisions, on which the end plate 3 then rests. The other L-leg has, at its end, resilient lamellae or barbs 16, by means of which the clamping ring 14 latches in on a corresponding shoulder of the mount 5. If required, instead of an encircling shoulder on the mount 5, it is also possible to provide a type of toothing formation, in which case the barbs 16 rest on the teeth. Separation of the clamping ring 14 in order to exchange the plate 3 may then take place in a straightforward manner by the clamping ring 14 being rotated slightly until the barbs 16 or resilient lamellae are staggered in relation to the teeth. A type of bayonet closure is formed in this way.

The mount 5 may consist of steel or, better, of glass, quartz, calcium fluoride or of ceramic materials. It is likewise possible for the mount 5 to be formed from two materials A material transition within the mount 5 may then take place by way of a corresponding isolating element.

As can be seen from the enlarged illustration of FIG. 6, the resilient elements 15 press onto the end plate 3 from beneath in each case by way of a rounded surface 17. A lateral displacement is possible in the case of low static friction of contact surfaces, which should be correspondingly polished for this purpose.

FIG. 7 shows an alternative to the configuration according to FIG. 6. As can be seen, a contact-pressure ring 18, which is arranged between the end plate 3 and the individual resilient elements 15, is provided here. The contact-pressure ring 18 butts flatly against the end plate 3. The connection to the resilient elements 15 takes place via a tip/groove connection, as a result of which precise positioning is achieved. For this purpose, the contact-pressure ring 18 has, on its underside, a corresponding groove 19 in the region of the resilient elements 15, or else an encircling grooved ring, and the resilient elements 15 terminate in each case in a contact-pressure tip 20, which presses into the grooved ring 19.

The clamping ring 14 with its individual resilient elements 15 and the barbs 16 may be formed by eroding cuts, as a result of which identical contact-pressure forces are produced. The multiplicity of resilient elements 15 result in a contact-pressure force which is distributed uniformly over the entire circumference of the end plate 3.

For the above-described connection, a considerable increase in the diameter of the end plate 3 is generally necessary. In order that an excessive increase in the amount of installation space required does not occur, it is also possible for the end plate to be provided, in the region in which the lens 2 is located on bearing feet 22 of the inner mount 4, with a reduced thickness in the form of an annular milled recess 3' (see dashed illustration from FIG. 1). In this way, the end plate 3, in order to reduce the amount of installation space required, can be moved up closer to the lens 2.

As an alternative to this, provision may be made, in order to avoid problems relating to installation space, for the lens 2 to have a radial bevel 21, on which the bearing feet 22 then act (see dashed illustration in FIG. 1). It is also possible in this configuration for the diameter of the end plate 3 to be smaller.

Figure 8:
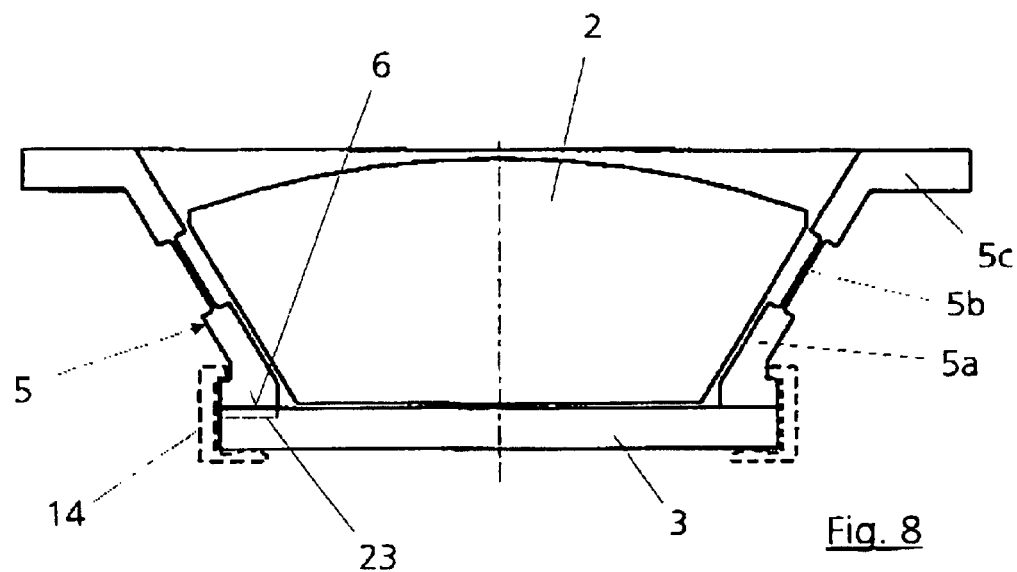
FIG. 8 shows a configuration of the bottom part of a lens system.

FIG. 8 shows the configuration of the bottom part of a lens system 1, the end plate 3 being mounted in a multi-part mount 5. The direct contact with the end plate 3 here is produced by a flange ring 5a which, for the connection, is provided with an optical quality fit or register with the fitting surface or surface fit 6. That end of the flange ring 5a which is directed away from the end plate 3 is adjoined by an annular isolating element 5b, which serves for isolating deformation and compensates for different coefficients of thermal expansion. The annular isolating element 5b may then be adjoined by a steel mount part 5c. The annular flange 5a preferably consists of glass or ceramic material. The connection or mounting of the end plate 3 via the fitting surface 6 may take place either by wringing or also—as illustrated by dashes—by a clamping device with the clamping ring 14 according to FIGS. 3 to 7.

Figure 2:
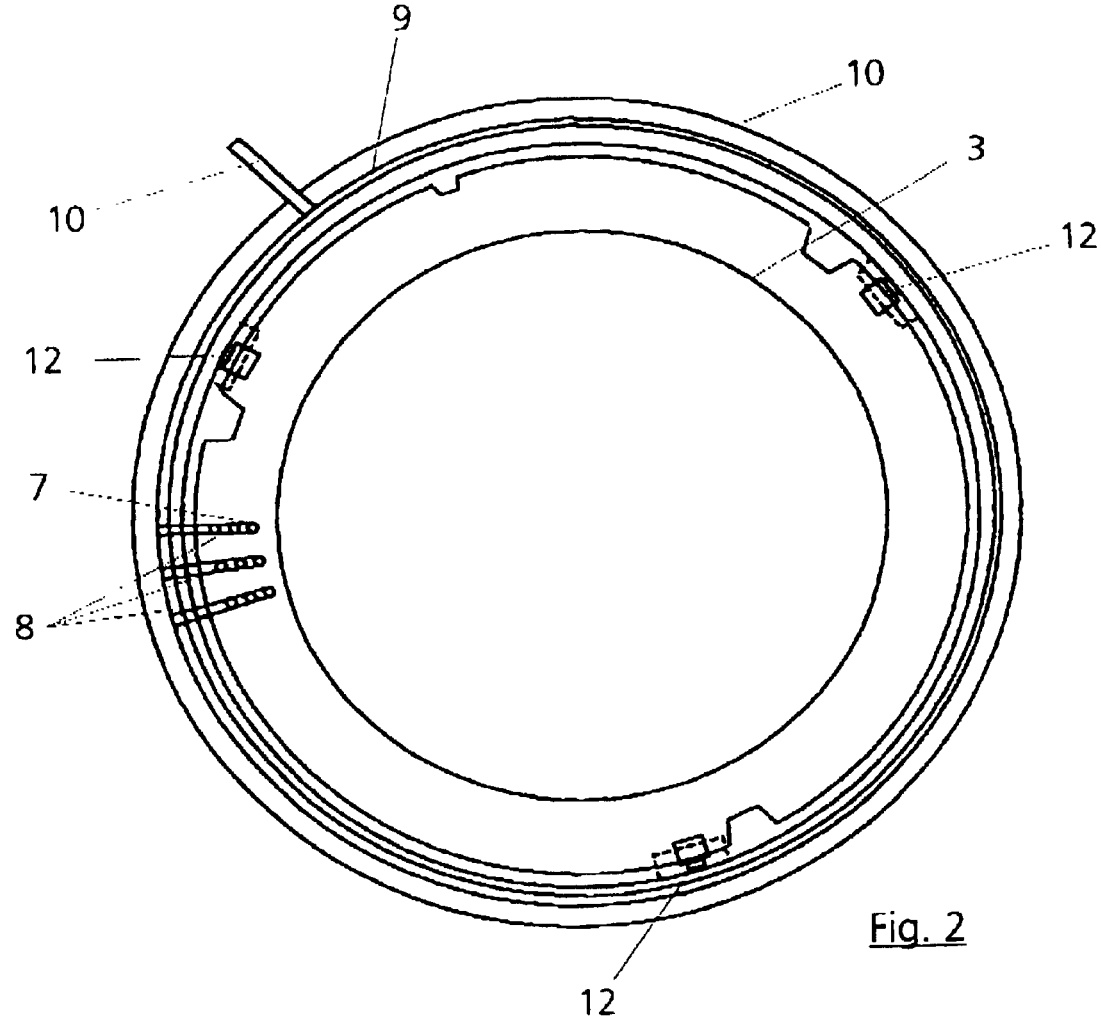
FIG. 2 shows a basic illustration in plan view of the lens system according to FIG. 1 in the bottom region.

It is, of course, also possible, however, to provide a pneumatic connection, as is described in FIGS. 1 and 2.

Figure 9:
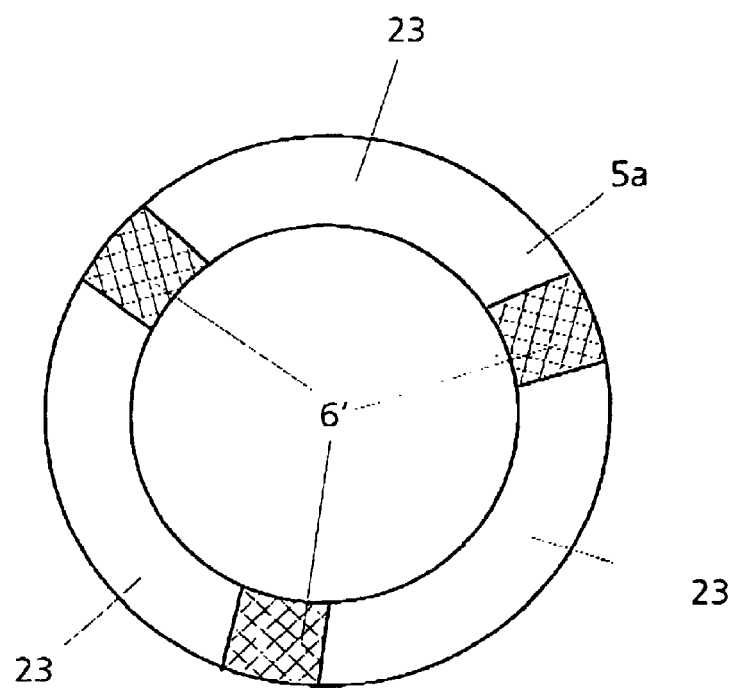
FIG. 9 shows a plan view of a flange ring in a multiplication of FIG. 8.

FIG. 9 shows a plan view of the flange ring 5a in a modification of FIG. 8. The connection in the form of a fitting surface 6 in relation to the end plate 3 used here is constituted by three connecting surfaces which are distributed uniformly over the circumference and are in the form of bearing surfaces 6'. The regions located therebetween are set back some way and are sealed, in the form of a gap 23, by a liquid, preferably a highly viscous liquid (see also dashed illustration on the left-hand side of FIG. 8). The highly viscous liquid used may be constituted, for example, by greases which provide sufficient sealing.

Instead of a three-part mount according to FIG. 8, it is, of course, also possible for the entire mount 5 to be produced from one material, e.g. ceramic material. The advantage of a mount 5 made of ceramic material is that it is lightweight and nevertheless very rigid and can also be machined to the desired optical accuracy. Furthermore, there are ceramic materials available which have the same coefficient of thermal expansion as the end plate 3.

Figure 10:
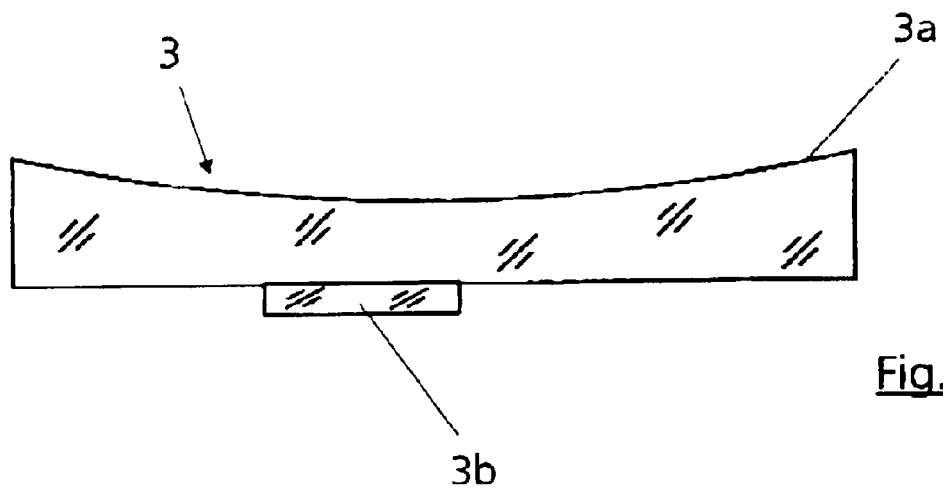
FIG. 10 shows a two-part end plate in section.
Figure 11:
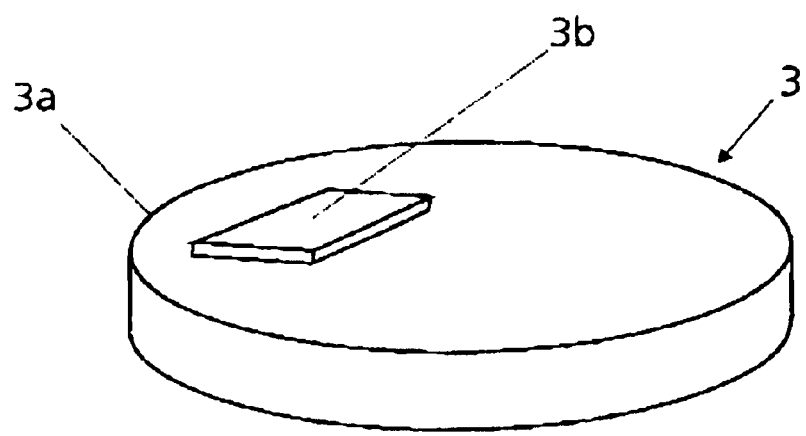
FIG. 11 shows a perspective view of the two-part end plate according to FIG. 10 from beneath.

FIG. 10 shows a two-part end plate 3 in section, while FIG. 11 illustrates a perspective view thereof.

As can be seen, the two-part end plate 3 comprises a thicker plate part 3a and a smaller and considerably thinner plate part 3b. The thinner plate part 3b may be wrung onto the thicker plate part 3a. The thicker plate part 3a ensures the necessary mechanical stability, while the thinner plate part 3b, which, if appropriate, may also be designed purely in sheet form, is located in the optically active region. This means that, for exchange purposes, all that is necessary is for the plate part 3b to be exchanged. The plate part 3b may be round or rectangular. Of course, instead of wringing onto the thicker plate part 3a, other fastening methods e.g. adhesive bonding or cementing, are also conceivable. The thinner plate part 3b may be adapted in shape to the thicker plate part 3a. This requires the thinner plate part 3b to be planeparallel. The advantage of this embodiment is that the sealing for the thicker plate 3a is simplified since it may remain in the installed state.

In the case of this exemplary embodiment, the optical quality fit with the fitting surface 6 is set between the two end plates 3a and 3b.

What is claimed is:

1. A lens system comprising an exchangeable optical element and a frame, said optical element being positioned relative to said frame in an optical quality fit with a fitting surface, said frame comprising a surface area of optical quality finish of form and surface, fitting to a surface area of said optical element, said optical element being in a projection lens system for semiconductor lithography, wherein said optical quality fit with a fitting surface between said optical element and said mount has a plurality of supporting surfaces distributed over the circumference, an intermediate gap sealed with a sealing liquid being provided in each case between the supporting surfaces.

2. The lens system as claimed in claim 1, wherein said exchangeable optical element is an end plate.

3. The lens system as claimed in claim 1, wherein the frame is glass or ceramic material.

4. The lens system as claimed in claim 1, wherein the frame for the exchangeable optical element comprises an inner mount and an outer mount, the inner mount forming an optical register with surface fit in relation to the exchangeable optical element, with a deformation-isolating element between the inner mount and the outer mount.

5. The lens system as claimed in claim 1, wherein said optical element is secured by a securing bracket against dropping out.

6. The lens system as claimed in claim 1, wherein said optical quality fit with a fitting surface is formed by wringing.

7. The lens system as claimed in claim 1, wherein said optical quality fit with a fitting surface is provided with a clamping device.

8. The lens system as claimed in claim 7, wherein said exchangeable optical element is provided with a clamping ring with resilient elements as a clamping device.

9. The lens system as claimed in claim 8, wherein said clamping ring has an L-shaped profile in section, said resilient elements being formed in one L-leg by radial incisions, on which said optical element rests, while the other L-leg produces the connection to the mount in the form of barbs.

10. The lens system as claimed in claim 8, wherein said resilient elements have contact-pressure tips which are pressed into an annular groove of a contact-pressure ring, which is arranged between said resilient elements and said exchangeable optical element.

11. The lens system as claimed in claim 9, wherein said radial incisions are formed in said clamping ring by sawing or by eroding cuts.

12. The lens system as claimed in claim 2, wherein said end plate comprises a thicker plate part forming a connection to the frame and a thin and small plate part being located in the optically active region, and said optical element with surface fit between said thicker plate part (3a) and said thin and small plate part.

13. The lens system as claimed in claim 1, wherein said frame comprises a flange ring connected to said exchangeable optical element via said surface fit, the flange ring adjoining an annular isolating element, and the isolating element connected to a steel mount part.

14. A lens system comprising at least one exchangeable optical element fixed within a frame, said optical element being an end plate in an optical quality fit with a fitting surface, said end plate having an enlarged diameter thereby forming said optical quality fit wherein said optical quality fit with a fitting surface between said optical element and said frame comprises a plurality of supporting surfaces distributed over the circumference, an intermediate gap sealed with a sealing liquid being provided in each case between the supporting surfaces.

15. A lens system for use in a projection lens system for semiconductor lithography comprising at least one exchangeable optical element and a circumferential border about said optical element, said optical element being fixed in a frame in an optical quality fit with a fitting surface, said optical quality fit formed by a plurality of discrete mounting surfaces for supporting said optical element about said circumferential border, said discrete mounting surfaces being separated by a sealing liquid on said optical element.

16. The lens system as claimed in claim 15, wherein said exchangeable optical element is an end plate.

17. The lens system as claimed in claim 15, wherein the frame is formed from glass or ceramic materials.

18. The lens system as claimed in claim 15, wherein the frame for the exchangeable option element comprises an inner mount and an outer mount, the inner mount forming an optical register with surface fit in relation to the exchangeable optical element, with a deformation-isolating element between the inner mount and the outer mount.

19. The lens system as claimed in claim 15, wherein said optical element is secured by a securing bracket against dropping out.

20. The lens system as claimed in claim 15, wherein said optical quality fit with a fitting surface between said optical element and said frame comprises a plurality of supporting surfaces distributed over the circumference, an intermediate gap sealed with a sealing liquid being provided in each case between the supporting surfaces.

21. The lens system as claimed in claim 14, wherein said optical quality fit with a fitting surface is formed by wringing.

22. The lens system as claimed in claim 15, wherein said exchangeable optical element is provided with a clamping ring with resilient elements as said clamping device.

23. The lens system as claimed in claim 22, wherein said clamping ring has an L-shaped profile in section, said resilient elements being formed in one L-leg by radial incisions, on which said optical element rests, while the other L-leg produces the connection to the frame in the form of barbs.

24. The lens system as claimed in claim 22, wherein said resilient elements have contact-pressure tips which are pressed into an annular groove of a contact-pressure ring, which is arranged between said resilient elements and said exchangeable optical element.

25. The lens system as claimed in claim 23, wherein said radial incisions are formed in said clamping ring by sawing or by eroding cuts.

26. The lens system as claimed in claim 14, wherein said end plate has two parts, a thick plate part connected to the frame and a thin and small plate part in the optically active region, and said optical element with a surface fit formed between said thick plate part and said thin and small plate part.

27. The lens system as claimed in claim 15, wherein said frame comprises a flange ring connected to said exchangeable optical element via said surface fit, the flange ring adjacent to an annular isolating element, and the isolating element connected to a steel frame part.

28. A lens system for use on a projection lens system for semiconductor lithography comprising at least one exchangeable optical element mounted within a frame, said optical element being positioned mounted in said frame in an optical quality fit with a fitting surface formed by wringing, wherein the frame for the exchangeable optical element comprises an inner mount and an outer mount, the inner mount forming an optical register with surface fit in relation to the exchangeable optical element, and a deformation-isolating element between the inner mount and the outer mount.

29. The lens system as claimed in claim 28, wherein the frame is formed from glass or ceramic material.

30. The lens system as claimed in claim 28, wherein said frame comprises a flange ring connected to said exchangeable optical element via said surface fit, the flange ring adjacent to an annular isolating element, and the isolating element connected to a steel frame part.

31. A lens system for use in a projection lens system for semiconductor lithography comprising at least one exchangeable optical element mounted within a frame, said optical element being positioned relative to said frame in an optical quality fit formed by a pneumatic means for generating a negative pressure between said exchangeable optical element and said frame.

32. The lens system as claimed in claim 31, wherein said exchangeable optical element is an end plate.

33. The lens system as claimed in claim 31, wherein the frame for the exchangeable optical element comprises an inner mount and an outer mount, the inner mount forming the optical register with a surface fit in relation to the exchangeable optical element, and a deformation-isolating element between the inner mount and the outer mount.

34. The lens system as claimed in claim 31, wherein said exchangeable end plate comprises a thick plate part connected to the frame and a thin and small plate part in the optically active region, and said optical element with a surface fit formed between said thick plate part and said thin and small plate part.

35. The lens system as claimed in claim 31, wherein said frame comprises a flange ring connected to said exchangeable optical element via said surface fit, the flange ring adjacent to an annular isolating element, and the isolating element connected to a steel frame part.

36. A lens system for use in a projection lens system for semiconductor lithography comprising at least one exchangeable optical element mounted within a frame, said optical element being fixed within said frame in an optical quality fit by a clamp, wherein said optical quality fit between said optical element and said frame is formed by a plurality of supporting surfaces distributed over a circumference of said frame, an intermediate gap sealed with a sealing liquid between the bearing surfaces.

37. A lens system in a projection lens system for semiconductor lithography comprising an exchangeable optical element and a frame, said optical element being positioned relative to said frame in an optical quality fit with a fitting surface, said frame comprising a surface area with an optical quality finish complementary to a surface area of said optical element, said optical element being an end plate in a projection lens system for semiconductor lithography, wherein said optical quality fit with a fitting surface between said optical element and said frame is formed by a plurality of support surfaces distributed over the circumference, an intermediate gap sealed with a sealing liquid being provided in each case between the support surfaces.

38. A lens system comprising an exchangeable optical element and a frame, said optical element being positioned relative to said frame in an optical quality fit with a fitting surface, said optical quality fit providing an adhesive-free connection between said optical element and said frame, wherein said fitting surface of said frame and the optical element have the same fit on an interferometric/optical scale.

39. The lens system as claimed in claim 38, wherein the same fit on an interferometric/optical scale comprises a fit with an exactness of less than 20 mm.

40. The lens system as claimed in claim 38, wherein said optical element is a part of a projection lens system for semiconductor lithography.

41. The lens system as claimed in claim 40, wherein said optical element is an end plate.

42. The lens system as claimed in claim 1, wherein said surface area of optical finish of form and surface, comprises a fit with an exactness on an interferometric/optical scale of less than 20 nm regarding said surface area of said optical element.

43. A lens system comprising an exchangeable optical element and a frame, said optical element being positioned relative to said frame in an optical quality fit with a fitting surface, said frame comprising a surface area of optical quality finish of form and surface, fitting to a surface area of said optical element, said optical element being in a projection lens system for semiconductor lithography, wherein said optical quality fit with a fitting surface between said optical element and said mount has a plurality of supporting surfaces distributed over the circumference, an intermediate gap sealed with a sealing liquid being provided in each case between the supporting surfaces.

44. A lens system comprising an exchangeable optical element and a frame, said optical element being positioned relative to said frame in an optical quality fit with a fitting surface, said frame comprising a surface area of optical quality finish of form and surface, fitting to a surface area of said optical element, said optical element being in a projection lens system for semiconductor lithography, wherein said optical quality fit with a fitting surface is formed by a pneumatic device which generates a negative pressure between said exchangeable optical element and the amount.

45. A lens system comprising at least one exchangeable optical element fixed within a frame, said optical element being an end plate in an optical quality fit with a fitting surface, said end plate having an enlarged diameter thereby forming said optical quality fit, wherein said optical quality fit with a fitting surface is formed by a pneumatic device which generates a negative pressure between said exchangeable optical element and the frame.

46. A lens system for use on a projection lens system for semiconductor lithography comprising at least one exchangeable optical element mounted within a frame, said optical element being positioned mounted in said frame in an optical quality fit with a fitting surface formed by wringing, wherein said exchangeable optical element comprises a thick plate part connected to the frame and a thin and small plate part in the optically active region, and said optical element with a surface fit formed between said thick plate part and said thin and small plate part.

* * * * *

UNITED STATES PATENT AND TRADEMARK OFFICE
CERTIFICATE OF CORRECTION

PATENT NO. : 7,061,698 B2
APPLICATION NO. : 10/131957
DATED : June 13, 2006
INVENTOR(S) : Osterried et al.

It is certified that error appears in the above-identified patent and that said Letters Patent is hereby corrected as shown below:

Column 1, line 14
The phrase "Description of the Related Art" should be a heading on its own line.

Column 2 line 54
Please delete "drawing" and insert --drawings--

Column 4, line 19
Please delete "materials A material" and insert --... materials. A material ...-- therefor Column 6, lines 37 and 40 (Claim 12)
Please delete "... thicker plate ..." and insert --... thick plate ...-- therefor Column 8, line 28 (Claim 36)
Please delete "... quality fit between ..." and insert --... quality fit with a fitting surface between ...-- therefor Column 8, line 55 (Claim 39)
Please delete "... 20 mm ..." and insert --... 20 nm ...-- therefor Column 8, line 62 (Claim 42)
Please delete "... optical finish of ..." and insert --... optical quality finish of ...-- therefor Column 9, line 20 (Claim 44)
Please delete "... and the amount ..." and insert --... and the mount ...--

Signed and Sealed this

Nineteenth Day of June, 2007

JON W. DUDAS
*Director of the United States Patent and Trademark Office*